United States Patent
De La Rosa et al.

[11] Patent Number: 6,166,547
[45] Date of Patent: Dec. 26, 2000

[54] LINE CARD LOSS OF BATTERY DETECTOR

[75] Inventors: Cesar Covarrubias De La Rosa; Frank Sciabica, both of Phoenix, Ariz.

[73] Assignee: AG Communication Systems Corporation, Phoenix, Ariz.

[21] Appl. No.: 09/524,600

[22] Filed: Mar. 14, 2000

[51] Int. Cl.[7] .................................................. G01N 27/42
[52] U.S. Cl. ................................... 324/425; 324/432
[58] Field of Search ................... 324/425, 426, 324/432; 320/143, 152

[56] References Cited

U.S. PATENT DOCUMENTS

| | | | |
|---|---|---|---|
| 5,214,369 | 5/1993 | McCrea | 320/143 |
| 5,444,777 | 8/1995 | Condon et al. | 379/413 |
| 5,684,384 | 11/1997 | Barkat et al. | 320/124 |
| 5,933,010 | 8/1999 | Moreno | 324/425 |

*Primary Examiner*—Peter S. Wong
*Assistant Examiner*—Lawrence Luk
*Attorney, Agent, or Firm*—David J. Zwick

[57] ABSTRACT

A line card circuit to prevent false off-hook signals resulting from the permanent loss of battery voltage at a line card. In the battery present condition, the 5V operating voltage is connected to the collector lead of an NPN transistor, which also supplies the output signal of the system. The emitter lead of the transistor is connected to ground. The −48V battery voltage is connected to the transistor base lead and biases the base negative with respect to the emitter, maintaining the 5V logic "1" output signal on the collector lead. There is a resistor and capacitor in series, forming an RC circuit, across the 5V collector lead and the −48V base lead. In the battery present condition, there is a significant charge across the capacitor. In the battery absent condition, the −48V battery voltage is lost and the voltage on the base lead rises to a positive voltage in a time interval governed by the discharge time of the RC circuit, thus causing the system output signal to drop to logic "0".

3 Claims, 1 Drawing Sheet

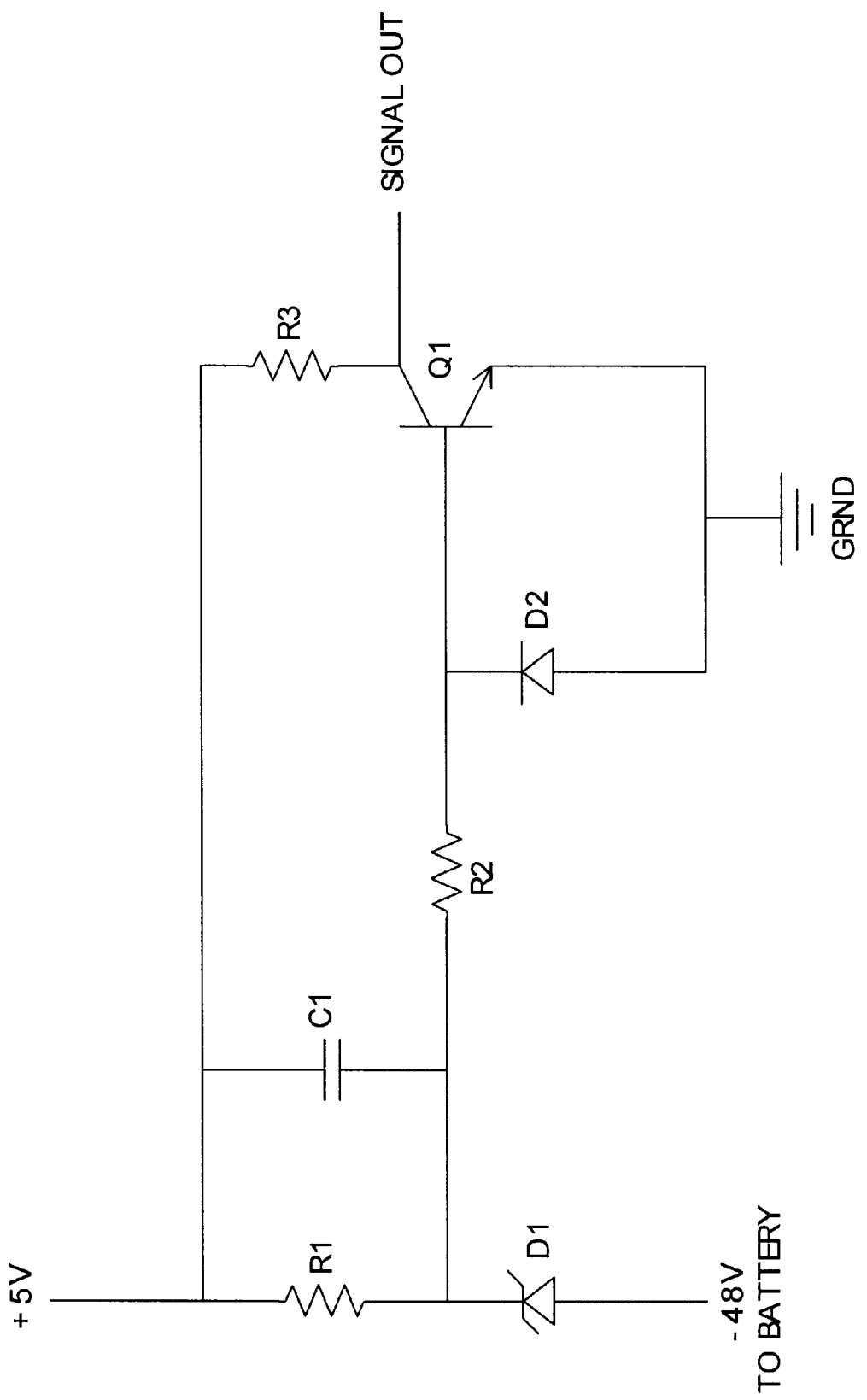

LINE CARD LOSS OF BATTERY DETECTOR

FIELD OF THE INVENTION

The present invention relates to battery voltage detection circuitry, and more particularly to a loss of battery voltage detector on a central office line card.

BACKGROUND OF THE INVENTION

In a central office switch, line cards are typically supplied with voltages that are derived from a single −48V battery source. For example, 5V DC power to the line card, converted from the −48V, supplies operating voltage for logic, and −48V DC filtered power, commonly referred to as "battery voltage", supplies the line power used for talking and signaling on/off-hook.

Loss of battery voltage is typically detected at a frame or shelf level when protection fuses blow. This is considered a major event causing various alarms to trip and power failure routines to kick in.

A loss of battery voltage caused by a catastrophic problem obviously should be treated as a major alarm. However, localized losses of battery voltage at a line card may also cause a substantial drain on system microprocessor resources. For example, a permanent loss of battery voltage at a line card may be interpreted by the system microprocessor as an off-hook condition for each line served by the line card, and the microprocessor could be flooded by false off-hook signals. Also, a localized loss of battery may be the consequence of a normal system activity, such as a hot swap of a nearby circuit board causing a temporary discharge of the local decoupling capacitors. This loss of battery may also be interpreted as an off-hook condition by the system microprocessor, causing the microprocessor to be flooded by false off-hook signals.

SUMMARY OF THE INVENTION

Accordingly, the objects of the invention are to provide a simple on-card battery voltage detection system that will ignore transient losses of battery voltage, and will signal permanent losses of battery voltage. The output signal of the battery voltage detection system will aid the system microprocessor in identifying "false" off-hook signals resulting from a permanent loss of battery voltage at a line card.

The invention of Applicants is a line card circuit that monitors battery voltage to the line card. In the normal battery present condition, the circuit outputs a logical 1 signal. When battery absent occurs, the circuit outputs a logical 0 signal after an engineerable delay. The length of the delay is engineered to ignore transient voltage drops, which the hookswitch detection circuitry normally ignores.

The invention works in conjunction with the 5V DC operating voltage and the −48V DC talk voltage supplied to the line card. In the battery present condition, the 5V operating voltage is connected to the collector lead of an NPN transistor, which also supplies the output signal of the invention. The emitter lead of the transistor is connected to ground. The −48V talk voltage is connected to the transistor base lead through a Zener diode and a resistor, and biases the base negative with respect to the emitter, keeping the transistor in "cut-off" mode and maintaining the 5V logic "1" output signal on the collector lead. In addition, there is another resistor and capacitor, forming an RC circuit, across the 5V collector lead and the base lead. In the battery present condition, there is a significant charge across the capacitor.

In the battery absent condition, the −48V talk battery is lost and the voltage on the base lead rises to a positive voltage in a time interval governed by the discharge time of the RC circuit. Eventually, the base to emitter voltage is sufficient to force the transistor into saturation, which allows current to flow from the collector to the emitter causing the voltage on the collector lead to drop to almost ground, and thus causing the system output signal to drop to logic "0".

Through the judicious choice of component values, the time delay between battery absent and a logical "0" output signal can be engineered so as to ignore transient losses of battery voltage of any desired length.

DESCRIPTION OF THE DRAWINGS

The FIGURE shows a circuit diagram of the preferred embodiment of Applicants' invention.

DESCRIPTION OF THE PREFERRED EMBODIMENT

The FIGURE shows a circuit diagram of the preferred embodiment of Applicants' invention. The circuit receives two power feeds. The first, labeled +5V, is connected to a 5 volt DC operational power feed for the line card upon which the circuit of the preferred embodiment resides. The second, labeled −48V, is connected to a −48 volt DC power feed that provides talk voltage to the subscriber lines of the line card. The anode side of a 27 volt Zener diode D1 is connected to the −48V feed of the circuit. Zener diode D1 serves to keep the negative battery voltage to the circuit at a reasonable value. The cathode side of Zener diode D1 is connected to a resistor R1 and capacitor C1 in parallel (R1C1). The other side of R1C1 is connected to the 5V feed of the circuit. The 5V side of R1C1 is also connected to a resistor R3, which is then connected to the collector of an NPN transistor Q1. A lead from the collector of transistor Q1 provides output signal SIGNAL OUT. The Zener diode side of R1C1 is also connected to a resistor R2 which is then connected to the base of transistor Q1. The emitter of Q1 is connected to ground. A diode D2 is connected between ground and the trace between resistor R2 and the base of transistor Q1.

In the preferred embodiment, resistors R1 and R2 have values of 215 KΩ, resistor R3 has a value of 49.9 KΩ, capacitor C1 has a value of 0.1 µF, and transistor Q1 is a model 2N2222A.

In the normal battery present condition, current flows from the 5V feed to the −48V feed through resistor R1 and Zener diode D1. Since Zener diode D1 is a 27 volt Zener diode, the cathode side of Zener diode D1 is at −21 volts relative to ground. This implies a 26 volt drop across resistor R1 to give +5 volts on the high side of resistor R1. Because capacitor C1 is in parallel with resistor R1, there is a 26 volt potential across capacitor C1.

There is also a current path from ground to the −48V feed through diode D2, resistor R2, and zener diode D1. There is a 0.7 volt drop across diode D2 which serves to keep the voltage on the base of transistor Q1 at a modest reverse bias voltage of −0.7 volts relative to the grounded emitter lead of Q1. Resistor R2 serves to control the current flow of this path.

Since the voltage on the base of transistor Q1 is −0.7 volts and the voltage on the emitter is 0 volts, transistor Q1 is in cut-off mode. This allows the voltage of signal SIGNAL OUT, which is connected to the collector of transistor Q1, and to the 5 volt feed through resistor R3, to remain at 5 volts. The 5 volt logic "1" signal on SIGNAL OUT is interpreted by the line card processor as indicating a normal battery present condition.

When the −48V talk voltage to the line card is lost, the circuit reaches a battery absent equilibrium state. In this state, current flows from the 5 volt feed to ground through resistor R3 and the collector-to-emitter path of transistor Q1. This current flow serves to keep the voltage relative to ground of signal SIGNAL OUT at a nominal 0.2 volts and a value of logic "0".

In the battery absent equilibrium state, current also flows from the 5 volt feed to ground through resistors R1 and R2 and the base-to-emitter junction of transistor Q1. Since there is a 0.7 volt drop across the base-to-emitter junction, there is a combined 4.3 volt drop across resistors R1 and R2. In the preferred embodiment, since resistors R1 and R2 have the same value, there is a 2.15 volt drop across each, and hence capacitor C1 has a battery absent equilibrium charge of 2.15 volts.

During the transition period in which the circuit reaches the battery absent equilibrium state, capacitor C1 discharges through resistors R1 and R2 causing the voltage on the base of transistor Q1 to rise to 0.7 volts, which in turn moves transistor Q1 to a "saturated" state and causes signal SIGNAL OUT to drop to a logic "0".

The length of the interval between loss of battery and signal SIGNAL OUT dropping to logic "0" is governed by the behavior of the RC circuit formed by resistors R1, R2 and capacitor C1 according to the familiar equation $$V(t) \alpha V_0 e^{-t/RC}.$$

In the preferred embodiment, where resistors R1 and R2 are in parallel with respect to capacitor C1, the denominator 11 of the exponential becomes the time constant $$C1 \left[ \frac{R1R2}{R1+R2} \right] = 10.75 \text{ ms.}$$

Solving for the time at which the voltage across capacitor C1 rises from the battery present equilibrium of −26V to 0.7V, the voltage at which signal SIGNAL OUT switches to a logical "0", yields about 32 ms.

This should be the time interval between a loss of battery and a logic "0" on signal SIGNAL OUT. However actual in-circuit times may vary and some testing and adjustments to circuit component values may be required to tune the circuit to the desired time interval.

While a preferred embodiment of a line card loss of battery detector has been particularly shown and described, it is not intended to be exhaustive nor to limit the invention to the embodiment disclosed. It will be apparent to persons having ordinary skill in the art that modifications can be made to the present invention without departing from the scope and spirit thereof. For example, component values of the circuit may be modified to generally work with any negative battery power feed and a positive operational power feed having sufficient voltage to cause transistor Q1 to saturate. In embodiments with a low voltage negative battery power feed, Zener diode D1 and diode D2 may not be needed.

It is intended that the scope of the invention be defined by the claims appended hereto and their equivalents.

What is claimed is:

1. A loss of battery detector for use on a line card, the line card having a positive voltage operational power feed, a negative voltage battery feed, and a connection to ground, said loss of battery detector comprising:

a first resistor connected at one end to the positive voltage operational power feed;

a capacitor connected at one end to the positive voltage operational power feed;

the other end of said first resister and the other end of said capacitor connected to the negative battery voltage feed;

a second resistor having one end connected to said other ends of said first resister and said capacitor;

a third resistor connected at one end to the positive voltage operational power feed;

an NPN transistor having it's base connected to the other end of said second resistor, it's emitter connected to said ground connection, and it's collector connected to the other end of said third resistor, said positive voltage operational power feed having sufficient voltage to cause said transistor to saturate; and a signal out lead connected to said collector of said transistor.

2. A loss of battery detector according to claim 1, further comprising a diode having it's cathode end connected to the base of said NPN transistor and the other end of said second resistor, and it's anode end connected to the ground connection.

3. A loss of battery detector according to claim 1, further comprising a Zener diode interposed between said first resistor, said first capacitor, said second resistor and the negative voltage battery feed such that the cathode end of said Zener diode is connected to the other end of said first resister, the other end of said first capacitor and the one end of said second resistor, and the anode end of said Zener diode connected to the negative voltage battery feed.

* * * * *